United States Patent [19]

Berger et al.

[11] 4,321,566
[45] Mar. 23, 1982

[54] ELECTRIC CHARGE INJECTION AND READING DEVICE AND APPLICATION OF SUCH A DEVICE

[75] Inventors: Jean L. Berger; Jean L. Coutures; Pierre Descure, all of Paris, France

[73] Assignee: Thomson-CSF, Paris, France

[21] Appl. No.: 136,373

[22] Filed: Apr. 1, 1980

[30] Foreign Application Priority Data

Apr. 6, 1979 [FR] France .................................. 79 08788

[51] Int. Cl.³ ...................... H03H 15/02; G11C 27/00
[52] U.S. Cl. ............................... 333/165; 307/221 D; 307/279; 328/151
[58] Field of Search ............... 333/165, 166; 307/279, 307/221 D, 304, 413; 357/24; 328/151, 167

[56] References Cited

U.S. PATENT DOCUMENTS 4,047,051 9/1977 Heller ............................ 307/221 D Primary Examiner—Marvin L. Nussbaum
Attorney, Agent, or Firm—Roland Plottel

[57] ABSTRACT

The invention relates to a device for reading a quantity of electric charges then injecting in a charge-transfer device a quantity of charges which depends on the quantity previously read. This device comprises a reading grid connected to the source of an MOS charge-injection transistor operating in saturation and formed from two diodes and a control grid.

9 Claims, 16 Drawing Figures

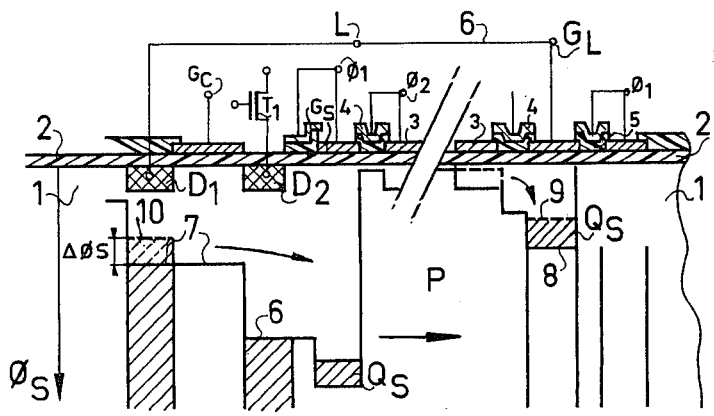
FIG_1
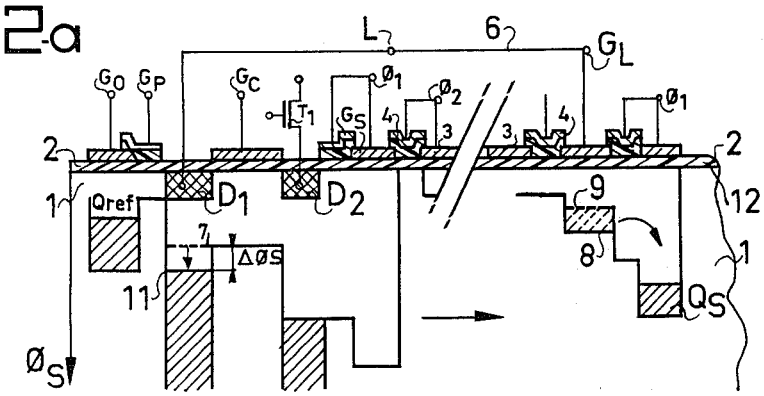
FIG_2
FIG_2a
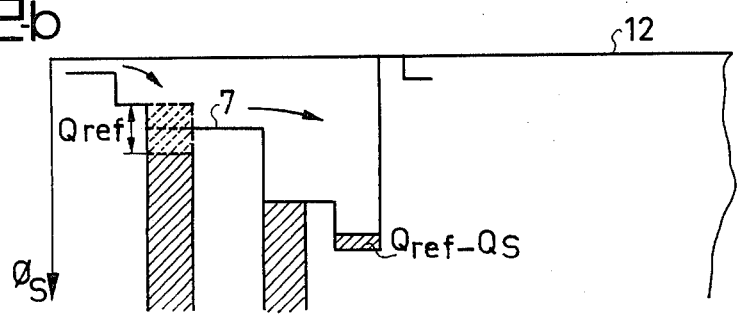
FIG_2b

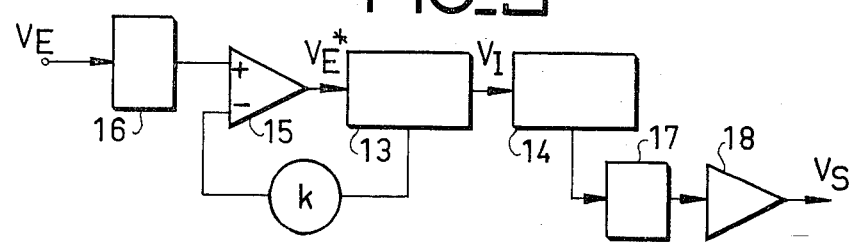
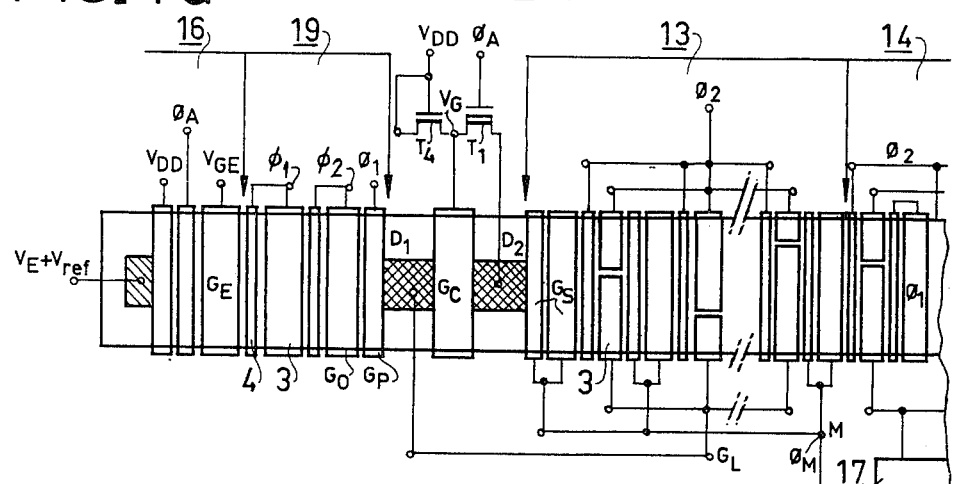
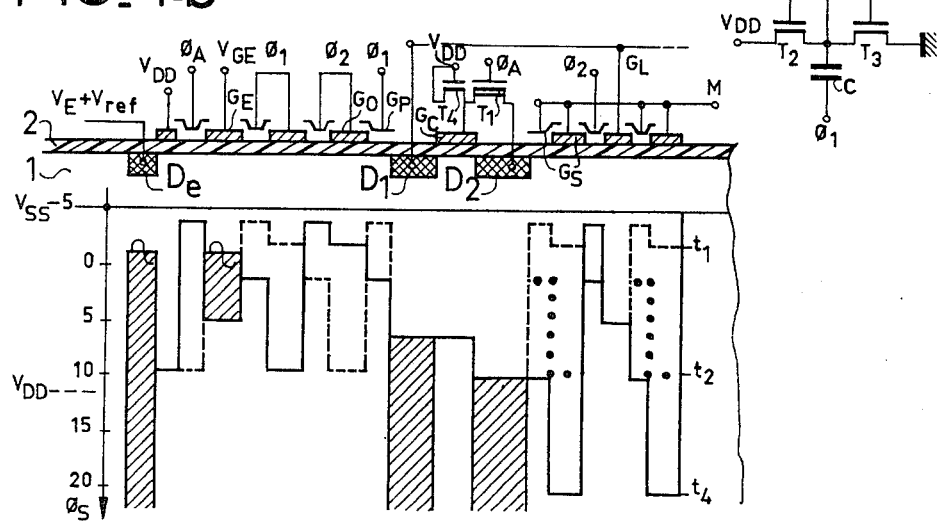

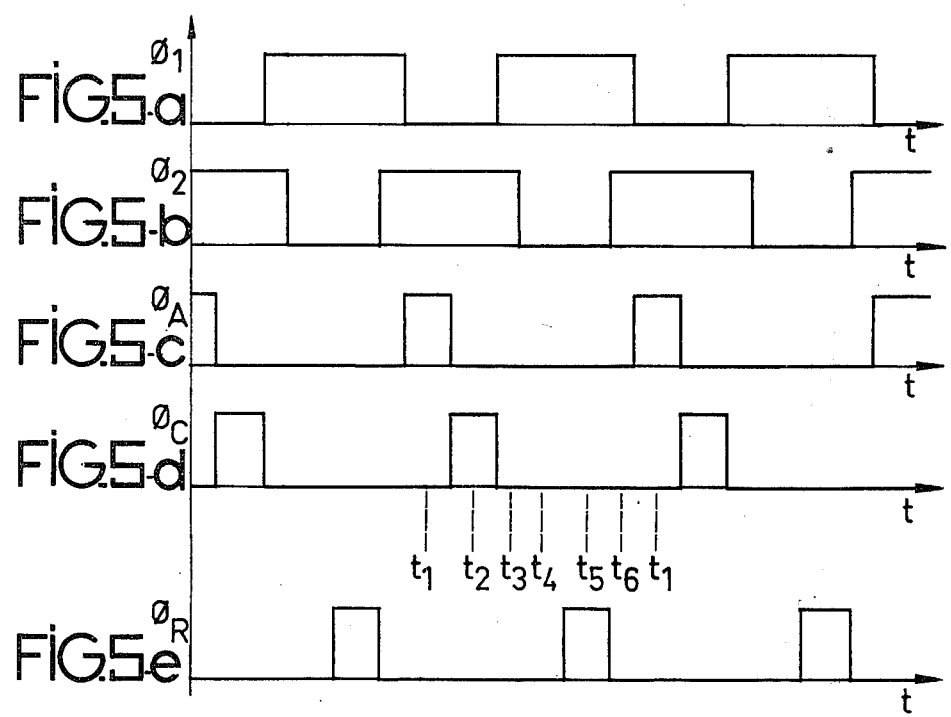
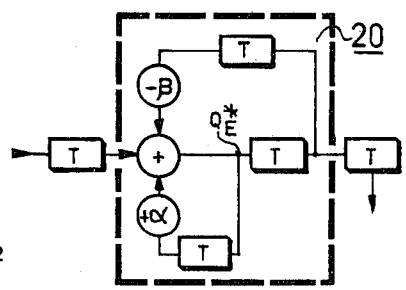
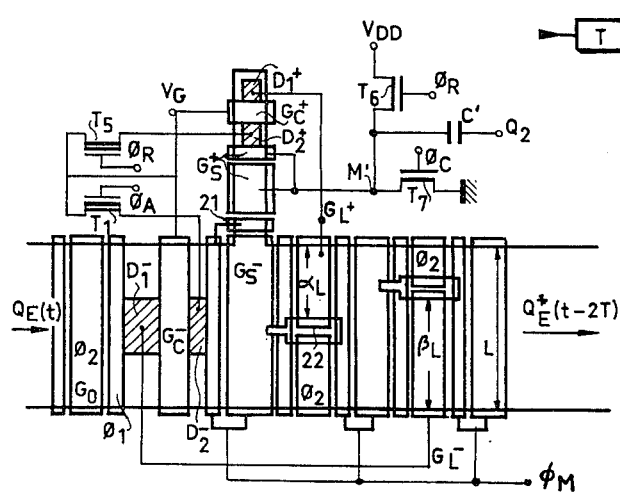

ELECTRIC CHARGE INJECTION AND READING DEVICE AND APPLICATION OF SUCH A DEVICE

BACKGROUND OF THE INVENTION

The present invention relates to an electric charge-reading and injection device. It also relates to the application of such a device to charge-transfer devices which comprise one or more filters or delay lines.

In numerous charge-transfer devices, it is necessary to read a quantity of electric charges then to inject into the device a quantity of charges which depends on the quantity of charges previously read.

This is the case for example with recursive filters where the quantity of charges injected into the filter is equal to the difference between the quantity of charges corresponding to the signal to be processed and the quantity of charges previously read.

Recursive filters of the prior art generally have a charge-reading device, such for example as the one described in French patent application No. 77 13 857, published under the number 2.839.899, in the name of THOMSON-CSF; this reading device converts the charges into an electric signal, either a current, or a voltage, which is fed to the negative input of a differential amplifier, connected to the input of the filter, which receives at its positive input the signal to be processed.

Recursive filters of the prior art present numerous drawbacks, among which may be mentioned:

the fact that the charge-reading device and the differential amplifier have an inherent gain which must be adjusted so as to inject into the filter a quantity of charges corresponding exactly to the difference between the quantity of charges corresponding to the signal to be processed and the quantity of charges previously read;

the space taken up by the charge-reading device and the differential amplifier which it is not always possible to integrate on the same substrate as the filter properly speaking, their high consumption for they generally comprise MOS transistors whose consumption is very much greater than that of the charge-transfer devices and finally the non-linearities likely to be introduced by the MOS transistors.

When several transversal filters are placed in series so as to obtain a frequency pattern with high rejection, or several delay lines, it is also necessary to read the charges at the output of each filter or each delay line then to inject the quantity of charges read in the following filter or delay line.

In the prior art, there is inserted between two filters or two delay lines a charge-reading device which presents the above-mentioned drawbacks of space taken up, consumption and non-linearity in particular.

SUMMARY OF THE INVENTION

The present invention relates to a device for reading and injecting electric charges which ensures the reading of charges in a charge-transfer device, comprising a semiconductor substrate covered by an insulating layer on which transfer electrodes alternate with charge-storage electrodes. These electrodes provide, on application of given potentials, the transfer of the charges in the substrate. At least one of the storage electrodes is connected electrically to the source of an MOS charge-injection transistor, biased to saturation, which is formed from two diodes and a control grid and which is integrated in a charge-transfer device.

The device of the invention may be used in particular for placing in series several transversal filters or several delay lines and for looping, in any order, recursive filters with positive and negative coefficients or with the same sign.

The device of the invention presents numerous advantages among which may be mentioned:

the fact that it does not require external adjustments;

its integration on the same semiconductor substrate as the charge-transfer device properly speaking;

its great stability and its great accuracy which are due in particular to the fact that it avoids the double conversion of electric charges into an electric signal and vice versa.

The above and other objects, features and advantages of the present invention will become apparent from the following description, given solely by way of non-limiting illustration, when taken in conjunction with the accompanying drawings.

DESCRIPTION OF THE DRAWINGS

FIG. 1 is a cross-sectional view of one embodiment of the reading and injection device of the invention and a diagram illustrating its operation.

FIGS. 2a and 2b show in cross-section another embodiment of the reading and injection device of the invention and two diagrams illustrating its operation.

FIG. 3 is a diagram of a charge-transfer device.

FIGS. 4a and 4b show in a top view and a cross-sectional view one embodiment in accordance with the invention of the device of FIG. 3 and a diagram illustrating the operation of this embodiment.

FIGS. 5a to 5e are diagrams of signals applicable to the charge-transfer devices comprising a reading and injection device of the invention.

FIG. 6 is another diagram of a charge-transfer device.

FIG. 7 is a top view of an embodiment in accordance with the invention of the device of FIG. 6.

In the different figures, the same references designate the same elements but, for the sake of clarity, the sizes and proportions of the different elements have not been respected.

DESCRIPTION OF THE PREFERRED EMBODIMENTS

FIG. 1 shows a view in cross-section, along the direction of propagation of the charges, of one embodiment of the charge-reading and injection device according to the invention.

A semiconductor substrate 1, made from type P silicon in the example, is covered with an insulating layer 2, made from silicon oxide in the example. On this insulating layer 2 are disposed charge-storage electrodes 3, substantially normally to the direction of propagation of the charges indicated by an arrow. Charge-transfer electrodes 4 alternate with the storage electrodes. The transfer electrodes 4 are deposited on a thicker portion 5 of the insulating layer.

As is known, this arrangement has a double function, on the one hand to ensure continuity of the potentials created in the semiconductor 1 and, on the other hand, to impose a single transfer direction for the charge-carriers.

This structure comprising a thicker portion of the insulating layer may be replaced by overdoping of the substrate, by implantation of ions, fulfilling the same functions.

Similarly, the description is made in the case of charge-transfer devices having two phases $\phi_1$ and $\phi_2$ each addressing a transfer electrode 4-storage electrode 3 pair, but the invention can also be applied to three-phase charge-transfer devices for example.

The reading and injection device of the invention ensures reading of the charges transitting under one or more storage electrodes, which may be divided up or not so as to assign weighting coefficients to the charge read.

In FIG. 1, a single storage electrode, called reading grid $G_L$, is connected electrically to the source of an MOS charge-injection transistor.

This injection transistor is formed by two diodes $D_1$ and $D_2$ integrated in a charge-transfer device which may or may not be the same as that in which the charges are read. These charge-transfer devices are generally integrated on the same semiconductor substrate 1. Diodes $D_1$ and $D_2$ are for example PN junctions formed by doping substrate 1 of type P. The MOS injection transistor also comprises a grid $G_c$, deposited on the insulating layer 2 between the two diodes, which controls the transfer of the charges.

Before charges arrive under the reading grid $G_L$, the injection transistor is saturation-biased.

For this purpose, control grid $G_c$ is maintained at a constant potential $V_G$ and diode $D_2$, which follows $D_1$ in the charge-transfer direction, is brought by an MOS transistor $T_1$ up to a high potential greater than $V_G$. Diode $D_1$ which forms the source of the injection transistor is only connected to the reading grid $G_I$ by a metallic lead 6, external to the semiconductor substrate and generally in aluminium.

FIG. 1 also comprises a diagram showing the operation of the charge-reading and injection device. This diagram shows the development of the surface potential $\phi_S$ in substrate 1. The hatched zones indicate the presence of minority carriers.

Diodes $D_1$ and $D_2$ form as it were sources of minority carriers, in which the level of the surface potential is shown by a line 6 for $D_2$ which is biased by transistor $T_1$ and by a line 7 for $D_1$. The surface potential under $D_1$ is aligned with the surface potential under the control grid $G_C$ which equals $V_G-V_T$, where $V_G$ is the biasing voltage of $G_C$ and $V_T$ the threshold voltage under $G_C$.

At the moment when a quantity of charges $Q_S$ arrives under $G_L$, the level of the surface potential under $G_L$ diminishes and passes from line 8 to line 9, shown by a broken line. Through electrostatic influence due to the electric connection 6, the potential under $D_1$ diminishes by $\Delta\phi_S$ such that: $\Delta\phi_S=Q_S/C_L$, where $C_L$ represents the capacity at point L, taken at the connection 6, in relation to the substrate. The potential under $D_1$ is then shown by a broken line 10.

Because of the potential barrier existing under $G_C$, the potential under $D_1$ comes back immediately to level 7 and the quantity of charges $Q_S$ is discharged under diode $D_2$. Before the quantity of charges $Q_S$ arrives under $G_L$, transistor $T_1$ has been disabled, the quantity of charges $Q_S$ is therefore not discharged by $T_1$ and is transferred from diode $D_2$ to the next storage electrode, driven by phase $\phi_1$, then towards the next storage electrode, driven by phase $\phi_2$, in accordance with the conventional principle of charge transfer.

The device shown in FIG. 1 makes possible therefore the reading of a quantity of charges $Q_S$ then the injection of this same quantity of charges. It may in particular be used for placing several delay lines or several transversal filters in series.

The charge-reading and injection device shown in cross-section in FIG. 2a differs from that shown in FIG. 1 because it comprises, upstream of the injection transistor in the charge-transfer direction, a storage electrode-transfer electrode pair.

In the case of FIG. 2, at the moment when charges arrive under $G_L$, transistor $T_1$ is maintained conducting and the transfer electrode-storage electrode pair which follows $D_2$ and which is shown by $G_S$ is at the low level. The quantity of charges $Q_S$ which is injected under $D_2$ is then discharged by transistor $T_1$.

The reading of the charges will then take place on the departure of the charges from $G_L$. FIG. 2a illustrates the development of the surface potential in the substrate at that moment. When the transfer electrode-storage electrode pair adjacent $G_L$, downstream of $G_L$, passes to the high level, the quantity of charges $Q_S$ leaves $G_L$. The potential under $G_L$ then increases and passes from level 9 to level 8. Through electrostatic influence, the potential under $D_1$ passes from level 7 to level 11 and increases by $\Delta\phi_S$ such that $\Delta\phi_S=Q_S/C_L$. The surface potential under $D_1$ (level 11) then equals $V_G-V_T+\Delta\phi_S$.

The storage electrode-transfer electrode pair which precedes $D_1$, then ensures the transfer under $D_1$ of a previously stored quantity of charges $Q_{ref}$. FIG. 2b shows the potentials in the substrate after this transfer.

In FIG. 2b, there is only shown the interface 12 of substrate 1 with insulating layer 2.

The quantity of charges $Q_{ref}$ fills the potential hole existing under diode $D_1$ up to level 7 corresponding to the potential barrier $V_G-V_T$ imposed by $G_C$ and the excess, i.e. the quantity of charges $Q_{ref}-Q_S$, passes under diode $D_2$ then under the following storage electrodes.

The device shown in FIGS. 2a and 2b makes possible therefore the reading of a quantity of charges $Q_S$, then the injection of a quantity of charges $Q_{ref}-Q_S$.

By way of example, two applications of the reading and injection device of the invention, illustrated in FIGS. 4a, 4b and 7, will now be described.

FIG. 3 shows a diagram of a charge-transfer device which comprises a recursive part 13 with weighting coefficients of the same sign in series with a non-recursive part 14. The recursive part is looped with a gain k to the negative input of a differential amplifier 15 which receives at its positive input a quantity of charges corresponding to the input voltage $V_E$ which is applied to a conventional charge-injection device 16. The non-recursive part is connected to a current charge-reading device 17 and to an output amplifier 18 which samples and holds the output voltage $V_S$.

The z transform of the transfer function of this charge-transfer device is written:

$$\frac{V_S(\omega)}{V_E(\omega)} = \frac{P(z)}{1 + kQ(z)} \cdot z^r \qquad (1)$$

where P(z) and Q(z) are the z transforms of the transfer functions of the non-recursive and recursive parts, where $z^r$ is the delay introduced by the recursive part and where $z=e^{-j\omega T}$, $F=1/T$ being the sampling frequency of the device.

FIG. 4a shows a top view of one embodiment in accordance with the invention of the device of FIG. 3 and FIG. 4b shows a view in cross-section, along the charge-transfer direction, of the device of FIG. 4a as well as a diagram illustrating the operation of this device.

The charge-transfer device is entirely integrated on the same substrate 1 covered with an insulating layer 2.

We find again in FIG. 4a the charge-reading and injection device shown in FIG. 2a:

the reading grid $G_L$ is formed by the connection of a part of the different cut storage electrodes 3 of the recursive part 13;

diode $D_1$ is connected to $G_L$ by a metallic lead external to the semiconductor substrate;

control grid $G_C$ is brought up to potential $V_G$ by an MOS transistor $T_4$ operating in saturation and connected to a voltage $V_{DD}$, such that $V_{DD} - V_T = V_G$;

diode $D_2$ is precharged by an MOS transistor $T_1$, driven by a phase $\phi_A$ and connected to $G_C$;

finally, upstream of diode $D_1$, is to be found a storage electrode-transfer electrode pair $G_o$, $G_p$ and downstream of diode $D_2$ there is to be found a transfer electrode-storage electrode pair $G_s$.

The input signal to be filtered $V_E$ is injected, superimposed on a reference voltage $V_{ref}$, onto a conventional charge-injection device 16, formed by an input diode $D_E$, followed by a screen grid connected to a voltage $V_{DD}$, by a sampling grid driven by the phase $\phi_A$ and a storage grid $G_E$ maintained at a fixed voltage $V_{GE}$.

The charge-injection device 16 is followed by an intermediate stage 19 formed from two transfer electrode 4-storage electrode 3 pairs connected to two phases $\phi_1$ and $\phi_2$ and followed by grid $G_p$ which is connected to phase $\phi_1$.

Then we find integrated on the substrate diode $D_1$, grid $G_C$ and diode $D_2$, then the recursive part 13. In the recursive part, two sorts of transfer electrode-storage electrode pairs are alternated.

On the one hand, pairs in which the storage electrode is not cut, and which are connected to a point M to which is connected a voltage doubler formed in a known way by a capacitor C connected to phase $\phi_1$, and two MOS transistors $T_2$ and $T_3$, driven by a phase $\phi_C$ and phase $\phi_A$ and connected respectively to voltage $V_{DD}$ and to ground.

On the other hand, couples in which the storage electrode is divided into two parts. The storage electrodes are connected together by one of their parts and form the reading grid $G_L$, whereas the complementary parts are connected to phase $\phi_2$. The transfer electrode of these pairs is also connected to phase $\phi_2$.

Following the recursive part, we find on the substrate the non-recursive part with its cut electrodes read by a charge-reading device 17.

The diagrams of FIGS. 5a to 5d show as a function of time the signals applicable to the device of FIGS. 4a and 4b.

FIGS. 5a to 5d show the potentials $\phi_1$, $\phi_2$, $\phi_A$, $\phi_C$ which are periodic functions having the same period T whose amplitude varies between a low level and a high level. The potentials $\phi_1$ and $\phi_2$ on the one hand and $\phi_A$ and $\phi_C$ on the other are preferably identical but out of phase.

During period T, potentials $\phi_1$ and $\phi_2$ are at the high level for a longer time than at a low level. These potentials are phase-shifted so that each of them passes to the low level, then comes back to the high level whereas the other potential is at the high level.

Potential $\phi_A$ passes to the high level when $\phi_1$ passes to the low level. Potential $\phi_C$ passes to the high level, when $\phi_A$ goes to the low level, then goes to the low level when $\phi_1$ rises to the high level.

The operation of the charge-transfer device shown in FIGS. 4a and 4b is the following:

At time $t_1$, $\phi_2$ and $\phi_A$ are at the high level, $\phi_1$ and $\phi_C$ are at the low level. A quantity of charges $Q_{ref} + Q_E(t)$ is injected on $G_E$. The signal charges previously injected are transferred under the cut electrodes of the recursive part by the resetting to zero of point M by transistor $T_3$ driven by $\phi_A$. Transistor $T_1$ is conducting and diode $D_2$ is at the potential $V_G$ applied to $G_C$. The potential under $D_1$ is aligned with that existing under $G_C$ and is equal to $V_G - V_T$. The charges transferred under $D_2$ by reduction of the potential under $D_1$ when signal charges arrive under the cut electrodes are thus discharged through $T_1$.

FIG. 4b shows the development of the potentials in the substrate. The profile of the potential at time $t_1$ is shown with a broken line.

It is assumed, by way of example, in FIG. 4b that voltage $V_{DD}$ equals 12 V and that the phases $\phi_1$, $\phi_2$, $\phi_A$, $\phi_C$ vary between 0 and 12 V.

The substrate of the device is brought to a potential $V_{SS} = -5$ V. The input grid $V_{GE}$ is at potential 5 V and finally, the control grid $G_C$ is brought to the potential $V_G = 9.5$ V, assuming the threshold voltage of transistor $T_4$ equal to 2.5 V.

At time $t_2$, phase $\phi_C$ passes to the high level and $\phi_A$ is at the low level. Diode $D_2$ is isolated and point M is brought substantially to $V_{DD}$ equal to 12 V by transistor $T_2$ driven by $\phi_C$ which charges the capacitor C. The profile of the potential at time $t_2$ is shown by a dotted line in FIG. 4b.

At time $t_3$, phase $\phi_C$ comes back to zero and phase $\phi_1$ passes to the high level. Point M is brought to $V_{DD} + V_{\phi 1}$, i.e. about 24 V. The potential under the electrodes adjacent the cut electrodes is such that there occurs a transfer of charges from the cut electrodes under the adjacent storage electrodes. Through electrostatic influence, the potential of diode $D_1$ increases by the value $\Delta\phi_S$ such that:

$$\Delta\phi_S = \frac{1}{C_L} \cdot \sum_{i=1}^{n} h_i \cdot Q_E^*(t - iT) = \frac{Q_n(t)}{C_L}$$

where $C_L$ is the total capacity of the reading grid $G_L$, n the number of storage electrodes forming the reading grid $G_L$ and $Q_E^*(t)$ the quantity of charges present at time $t + t_4$ under electrode $G_S$.

At time $t_4$, the potential $\phi_2$ comes back to zero. The charges $Q_{ref} + Q_E(r-T)$ present under the grid $G_E$ are transferred under diode $D_1$, $Q_E(t)$ being the quantity of charges present under the storage electrode $G_O$ at time $t + t_1$. Diode $D_1$ is restored to the potential $V_G - V_T = 7$ V, the excess of charges is transferred under diode $D_2$ then under storage electrode $G_S$.

This excess of charges is written:

$$Q_E^*(t) = Q_{ref} + Q_E(t-T) - C_L\Delta\phi_S = Q_{ref} + Q_E(t-T) - Q_n(t).$$

Passing into the realm of frequencies, the preceding relationship is written:

$$Q_E^*(\omega) = Q_E(\omega) e^{-j\omega T} - Q_n(\omega) =$$

$$Q_E(\omega) e^{-j\omega T} - Q_E^*(\omega) \cdot \sum_{i=1}^{n} h_i e^{-j\omega iT}$$

From which:

$$\frac{Q_E^*(\omega)}{Q_E(\omega)} = \frac{e^{-j\omega T}}{1 + \sum_{i=1}^{n} h_i e^{-j\omega iT}} = \frac{z}{1 + Q(z)}$$

The z transform of the transfer function of the whole of the charge-transfer device is then equal to $$\frac{P(z) \cdot z^{n+1}}{1 + Q(z)}$$

which fully corresponds to the theoretical formula (1) in the case where the loop gain k is equal to 1 and where r=n+1 for the intermediate stage 19 comprises two transfer electrode-storage electrode pairs and introduces an additional pure delay equal to T.

The profile of the potentials at time $t_4$ is shown by a continuous line in FIG. 4b.

The device shown in FIGS. 4a and 4b enables then a recursive filter to be obtained of the nth order with coefficients of the same sign in series with a non-recursive filter.

The charge-transfer device shown in FIGS. 4a and 4b must comprise a recursive part having weighting coefficients of the same sign for reinjection to be always possible. FIG. 7 shows one emodiment in accordance with the invention of a charge-transfer device, the diagram of which is shown in FIG. 6, and which comprises a positive coefficient and a negative coefficient.

FIG. 6 shows the simplified diagram of a recursive cell of the second order 20 having a positive coefficient $\alpha$ and a negative coefficient $\beta$.

The reinjection of the negative coefficient $\beta$ takes place through a structure strictly identical to that which is shown in FIG. 4a, by reading on departure of the charges from the reading grid. There is shown by $D_1^-$, $G_C^-$, $D_2^-$, the elements of the injection transistor, by $G_S^-$ the transfer electrode-storage electrode pair which follows $D_2^-$, and by $\phi_M$, the signal available at point M in FIG. 4a.

The reading grid $G_L^-$ is constituted by one part of length $\beta L$ of a storage electrode of length L divided into two parts and connected by a metallic lead external to the substrate with the diode $D_1^-$.

The reinjection of the positive coefficient $\alpha$ takes place through a second charge-transfer device, disposed perpendicularly to the charge-transfer device which elaborates the negative coefficient; this second device comprises a charge-reading and injection device such as the one shown in FIG. 1 and where the reading takes place on arrival of the charges under the reading grid. This device is formed from two diodes $D_1^+$ and $D_2^+$ and a control grid $G_C^+$, followed by a transfer electrode-storage electrode pair $G_S^+$, which may be put into relationship by means of a transfer grid 21 connected to $\phi_M$ with the storage grid $G_S^-$ of the first substrate 1.

The control grids $G_C^+$ and $G_C^+$ are brought to the same potential $V_G$ and diodes $D_2^+$ and $D_2^-$ are connected to the two grids $G_C^+$ and $G_C^-$ through two MOS transistors $T_5$ and $T_1$ driven by the phases $\phi_R$ and $\phi_A$. Finally, the transfer electrode-storage electrode pair $G_S^+$ is connected at a point M' to a voltage doubler formed by a capacitor C' connected to the potential $\phi_2$ and two MOS transistors $T_6$ and $T_7$ connected to $V_{DD}$ and to ground and driven by $\phi_R$ and $\phi_C$.

Finally, diode $D_1^+$ is connected by a metallic lead external to the substrate with one part of length $\alpha L$ of a storage electrode length L and divided into two parts which constitutes the reading grid $G_L^+$.

The transfer electrode-storage electrode pair $G_L^+$ follows, according to the charge transfer direction that is to say from left to right, the transfer electrode-storage electrode pair $G_S^-$ and precedes a transfer electrode-whole storage electrode pair connected with $\phi_M$ and followed by the transfer electrode-storage electrode pair $G_L^-$.

A non-recursive filter may be integrated on the same substrate after the recursive filter.

The device shown in FIG. 7 may be driven by the potentials $\phi_1$, $\phi_2$, $\phi_A$, $\phi_C$ shown in FIGS. 5a to 5d and by a potential $\phi_R$ shown in FIG. 5e. Potential $\phi_R$ is identical to $\phi_A$ and $\phi_C$ but is phase-shifted in relation to these potentials. The potential $\phi_R$ is at the high level when $\phi_1$ is at the high level, but it passes to the low level before $\phi_1$, when $\phi_2$ passes to the high level.

The operation of the device shown in FIG. 7 is the following:

At time $t_5$, phase $\phi_R$ is at the high level. Diode $D_2^+$ is precharged to potential $V_G$ by transistor $T_5$, and the electrode pair $G_S^+$ is brought to the potential $V_{DD}$ by transistor $T_6$ which charges the capacitor C'.

At time $t_6$, phase $\phi_2$ is at the high level and phase $\phi_R$ is at the low level. Through the capacitor C', point M' and so the electrode pair $G_S^+$, is brought to the potential $V_{DD}+V_{\phi 2}$. Diode $D_2^+$ is isolated.

At time $t_1$, phase $\phi_A$ passes to the high level, phase $\phi_M$ is therefore cancelled (see FIG. 4a) and a quantity of charges $Q_E^*(t-T)$ is transferred under the reading grid $G_L^+$. $Q_E^*(t)$ represents the quantity of charges present under the storage electrode $G_S^-$ at time $t+t_4$. A reduction in potential then occurs under diode $D_1^+$ and a quantity of charges $\alpha Q_E^*(t-T)$ is injected under the storage grid $G_S^+$.

At time $t_2$, phase $\phi_C$ passes to the high level. The storage electrode $G_S^+$ is brought back to zero, storage electrode $G_S^-$ and transfer electrode 21 are brought to $V_{DD}$. The quantity of charges $\alpha Q_E^*(t-T)$ is transferred under $G_S^-$.

At time $t_4$, the quantity of charges $Q_E(t) - \beta Q_E^*(t-2T)$ is transferred under the storage electrode $G_S^-$ by reading of the negative coefficient. $Q_E(t)$ represents the quantity of charges present under $G_O$ at time $t+t_1$.

The quantity of charges present under the storage electrode $G_S^-$ is then written:

$$Q_E^*(t) = Q_E(t) - \beta Q_E^*(t-2T) + \alpha Q_E^*(t-T)$$

In the realm of frequencies, the transfer function of the device is written:

$$\frac{Q_E^*(\omega)}{Q_E(\omega)} = \frac{1}{1 - \alpha z + \beta z^2},$$

which is indeed the desired transfer function of the second order with a positive coefficient and a negative coefficient.

FIG. 7 shows then one embodiment according to the invention of a recursive cell of the second order, shown in FIG. 6, which has a positive coefficient $\alpha$ and a negative coefficient $\beta$.

The advantage of this cell is that a recursive filter of the nth order may be broken down into placing cells of this type in series with a reduction of the sensitivity of the coefficients in relation to the recursive filter of the nth order formed by a single cell such as that shown in FIG. 7 and whose reading grids $G_L^+$ and $G_L^-$ are formed by several cut electrodes of lengths $\alpha_1 L$, $\alpha_2 L$, . . . and $\beta_1 L$, $\beta_2 L$ . . . .

The dynamics of the reading and injection device of the invention may be increased by lowering the threshold under the control grid of the injection transistor by an N type implantation in the example where the substrate is of type P and by thus transforming the injection transistor into an MOS depletion transistor.

In the recursive parts of the charge-transfer device shown in FIGS. 4a, 4b and 7, the potential of the cut electrode portions which form the reading grid $G_L$ is smaller than that of the other cut electrode portions connected to potential $\phi_2$. The dividing-up of the charge must then take place in a way known per se, under the preceding electrode where the potential is homogeneous because of the insulation diffusions 22, shown in FIG. 7.

It is apparent that within the scope of the invention, modifications and different arrangements can be made other than are here disclosed. The present disclosure is merely illustrative with the invention comprehending all variations thereof.

What is claimed is:

1. A charge transfer device including a charge injection and reading device, comprising a semiconductor substrate covered by an insulating layer on which transfer electrodes are alternated with charge-storage electrodes, these electrodes ensuring on application of given potentials, the transfer of charges in the substrate, wherein at least one charge storage electrode is electrically connected to the source of an MOS saturation-biased charge-injection transistor which is formed from two diodes constituting its drain and its source and from a control grid and which is integrated in a charge-transfer device.

2. The device as claimed in claim 1, wherein the drain of the MOS injection transistor is connected to a transistor which is maintained conducting when charges arrive under the storage electrodes and wherein a storage electrode-transfer electrode pair, disposed upstream of the injection transistor in the charge-transfer direction, ensures the transfer under the source of the injection transistor of a quantity of reference charges after departure of the charges from the storage electrodes.

3. The device as claimed in claim 1 or claim 2, wherein the charge-transfer device in which the reading is carried out and the charge-transfer device in which the MOS charge-injection transistor is integrated are formed on the same semiconductor substrate.

4. The device as claimed in claim 3, wherein the MOS charge-injection transistor is integrated in the charge-transfer device in which the reading of the charges takes place.

5. The device as claimed in claim 1, wherein the MOS charge-injection transistor is an MOS depletion transistor.

6. A charge-transfer device comprising at least two transversal filters in series, which are called the first filter and the second filter, wherein a device such as claimed in claim 1 is provided for reading charges in the first filter and for injecting the same quantity of charges in the second filter in which the MOS charge-injection transistor is integrated.

7. A charge-transfer device comprising at least two delay lines in series which are called the first delay line and the second delay line, wherein a device such as claimed in claim 1 is provided for reading charges in the first delay line and injecting the same quantity of charges in the second delay line in which the MOS charge-injection transistor is integrated.

8. A charge transfer recursive filter of the nth order having coefficients of the same sign, wherein a device such as claimed in claim 2 is provided for looping the filter, the quantity of reference charges corresponding to the signal to be processed present at the input of the filter and the MOS charge-injection transistor being integrated substantially at the input of the filter.

9. A charge-transfer recursive filter of the nth order having positive and negative coefficients, wherein it comprises a charge-injection and reading device, comprising a semiconductor substrate covered by an insulating layer on which transfer electrodes are alternated with charge-storage electrodes, these electrodes ensuring on application of given potentials, the transfer of charges in the substrate, at least one charge storage electrode being electrically connected to the source of an MOS saturation-biased charge-injection transistor which is formed from two diodes constituting its drain and its source and from a control grid and which is integrated in a charge-transfer device, the drain of the MOS injection transistor being connected to a transistor which is maintained conducting when charges arrive under the storage electrodes and a storage electrode-transfer electrode pair, disposed upstream of the injection transistor in the charge-transfer direction, ensuring the transfer under the source of the injection transistor of a quantity of reference charges after departure of the charges from the storage electrodes, this charge injection and reading device being formed on a first charge-transfer device which ensures elaboration of the negative coefficients of the filter, the quantity of reference charges corresponding to the signal to be processed present at the input of the filter, and the MOS charge-injection transistor being integrated substantially at the input of the filter, and wherein another charge injection and reading device being provided for elaborating the positive coefficients of the filter, said device comprising a semiconductor substrate covered by an insulating layer on which transfer electrodes are alternated with charge-storage electrodes, these electrodes ensuring on application of given potentials, the transfer of charges in the substrate, at least one charge storage electrode being electrically connected to the source of an MOS saturation-biased charge-injection transistor which is formed from two diodes constituting its drain and its source and from a control grid, and the MOS charge-injection transistor of which being integrated on a second charge-transfer device disposed perpendicularly to the first one.

* * * * *